US010574050B2

(12) United States Patent
Jankowski (10) Patent No.: US 10,574,050 B2
(45) Date of Patent: Feb. 25, 2020

(54) DOCKING MODULE FOR A CURRENT TRANSFORMER FOR PREVENTING OVERVOLTAGES AND A CURRENT TRANSFORMER HAVING A DOCKING MODULE

(71) Applicant: Phoenix Contact GmbH & Co. KG, Blomberg (DE)

(72) Inventor: Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 502 days.

(21) Appl. No.: 15/306,199

(22) PCT Filed: Apr. 24, 2015

(86) PCT No.: PCT/EP2015/058903
§ 371 (c)(1),
(2) Date: Oct. 24, 2016

(87) PCT Pub. No.: WO2015/162253
PCT Pub. Date: Oct. 29, 2015

(65) Prior Publication Data
US 2017/0047734 A1 Feb. 16, 2017

(30) Foreign Application Priority Data
Apr. 25, 2014 (DE) .......................... 10 2014 105 888

(51) Int. Cl.
*H02H 9/00* (2006.01)
*H02H 9/04* (2006.01)
(Continued)

(52) U.S. Cl.
CPC ............... *H02H 9/041* (2013.01); *G01R 1/36* (2013.01); *G01R 19/165* (2013.01);
(Continued)

(58) Field of Classification Search
None
See application file for complete search history.

(56) References Cited

U.S. PATENT DOCUMENTS 4,300,110 A * 11/1981 Bayer .................... H01H 71/10
200/50.28
4,698,740 A 10/1987 Rodgers et al.
(Continued)

FOREIGN PATENT DOCUMENTS

CN 102460854 A 5/2012
DE 19641187 A1 4/1998
(Continued)

OTHER PUBLICATIONS

Chinese Office Action, Application No. 201580021948.8, Applicant: Phoenix Contact GmbH & Co. KG, Title: Docking Module for a Current Transformer for Preventing Overvoltages and a Current Transformer Having a Docking Module, dated Sep. 28, 2018.
(Continued)

*Primary Examiner* — Stephen W Jackson
(74) *Attorney, Agent, or Firm* — Reising Ethington PC (57) ABSTRACT

The present disclosure relates to a docking module for a current transformer comprising:
an electronic circuit and
at least one electric connecting element for electrically coupling the circuit to the current transformer and for docking the docking module onto the current transformer.

21 Claims, 4 Drawing Sheets

(51) Int. Cl.
*H01F 27/40* (2006.01)
*H01F 27/42* (2006.01)
*H01F 38/32* (2006.01)
*G01R 1/36* (2006.01)
*H02H 7/04* (2006.01)
*G01R 19/165* (2006.01)
*H01F 27/02* (2006.01)
*H01F 27/34* (2006.01)
*H01R 4/30* (2006.01)
*G01R 15/18* (2006.01)

(52) U.S. Cl.
CPC ..... *G01R 19/16538* (2013.01); *H01F 27/027* (2013.01); *H01F 27/343* (2013.01); *H01F 27/402* (2013.01); *H01F 27/427* (2013.01); *H01F 38/32* (2013.01); *H01R 4/30* (2013.01); *H02H 7/042* (2013.01); *H02H 9/005* (2013.01); *G01R 15/183* (2013.01)

(56) References Cited

U.S. PATENT DOCUMENTS

2012/0250205 A1 10/2012 Pfitzer et al.
2015/0333509 A1* 11/2015 Jankowski ............... G01R 1/36
361/35

FOREIGN PATENT DOCUMENTS

EP 0559580 A1 9/1993
WO 2010120877 A1 10/2010

OTHER PUBLICATIONS

International Search Report and Written Opinion, Int. Serial No. PCT/EP2015/058903, Int. Filing Date: Apr. 24, 2015, Applicant: Phoenix Contact GmbH & Co. KG, dated Oct. 8, 2015.
PCT Communication—Relating partial Int. Search, Int. Serial No. PCT/EP2015/058903, Int. Filing Date: Apr. 24, 2015, Applicant: Phoenix Contact GmbH & Co. KG, dated Jul. 2, 2015.
Search for Parallel German Patent Application, Serial No. 10 2014 105 888.7, Applicant: Phoenix Contact GmbH & Co. KG, dated Dec. 17, 2014.
English Translation of International Preliminary Examination Report, Int. Serial No. PCT/EP2015/058903, Int. Filing Date: Apr. 24, 2015, Applicant: Phoenix Contact GmbH and Co. KG, dated Nov. 3, 2016.
Chinese Office Action, Application No. 201580021948.8, Applicant: Phoenix Contact GmbH & Co. KG, dated Jan. 23, 2018.

* cited by examiner

DOCKING MODULE FOR A CURRENT TRANSFORMER FOR PREVENTING OVERVOLTAGES AND A CURRENT TRANSFORMER HAVING A DOCKING MODULE

TECHNICAL FIELD

The present disclosure relates to a docking module for a current transformer comprising an electronic circuit, preferably a protective circuit for the current transformer for preventing a secondary voltage of a secondary circuit of the current transformer from exceeding a secondary voltage threshold. The present disclosure furthermore relates to a current transformer comprising a docking module.

BACKGROUND

Current transformers generally operate with a low-resistance burden of less than one ohm, for example when using an ammeter in the secondary circuit. Since the secondary voltage is proportional to the burden, the voltage at the secondary terminals might assume unacceptably high values in case of an idle secondary connection. In order to achieve protection of the transformer in the event of an interruption of its secondary side short-circuit, for example when the metering device including its shunt resistor is removed, circuit breakers have been known for re-establishing the short-circuit upon occurrence of unacceptably high secondary voltages.

Voltage peaks that may occur in case of an open secondary circuit of the current transformer might be very high and therefore life-threatening and may moreover result in damage of the current transformer.

As a remedy, short-circuiting devices have been known which are short-circuiting instantaneously, for example using diodes or relays, or with a delay. For delayed short-circuiting, implementations are known which periodically short-circuit, for example using a thermistor, or which permanently short-circuit, for example upon softening of a spacer.

Devices that are short-circuiting when a secondary cover is lifted or a connector is unplugged are problematic as they do not have any effect in case of an interruption elsewhere in the secondary circuit.

Relays can be designed so as to automatically re-enable the current transformer secondary circuit once the interruption has been rectified, and that without major delays.

However, usually such a device cannot be accommodated in a secondary terminal box of a current transformer. Moreover it is expensive and does not always meet the high operational requirements in terms of operational safety and weather resistance.

From FR 1 178 783, for example, a circuit breaker is known wherein in the event of unacceptably high secondary voltages a voltage-dependent circuit element actuates a switch powered by the current transformer. The secondary winding and the burden of the converter have connected in parallel thereto a series connection of two antiparallel-connected rectifiers and a relay implemented as a thermal overload relay. If the secondary voltage reaches a critical value the relay is responsive to close a contact which establishes a short-circuit path bridging either only the rectifiers, or the series connection of rectifiers and relay.

A drawback of this known circuit breaker is its high inertness so that both the response and the restoration of the normal operating condition after the decay of the excessively high secondary voltage are effected with a time delay. Furthermore, due to its size it is difficult for such a circuit breaker to be accommodated in the secondary terminal box of the current transformer, moreover it is expensive and problematic in terms of operational safety.

General Description

The present disclosure is based on the object of enhancing a protective circuit for a current transformer in terms of quicker response, higher load current, better operational safety, lower overall volume, and lower production costs.

This object is achieved by the subject matter of one or more of the independent claims. Various embodiments and modifications are specified in the dependent claims. The features of the embodiments may be combined with each other and with the features of the independent claims, as far as technologically appropriate.

One aspect of the present disclosure relates to a docking module for a current transformer. The docking module is preferably located outside of a current transformer and can be docked or coupled to the current transformer by being mechanically fastened thereto. The docking module may comprise an electronic circuit for the current transformer and at least one electric connecting element for electrically coupling the circuit to the current transformer and for docking the docking module onto the current transformer.

Docking in this case preferably comprises mechanical fastening of the docking module to the current transformer. This means that the docking module is located outside of the current transformer and can be docked or coupled to the current transformer by being mechanically fastened thereto. In order to facilitate the docking, the current transformers may have at least one opening in an outer area thereof into which the at least one connecting element can be inserted.

Preferably the docking module comprises two electric connecting elements, in particular for providing a voltage or for transmitting a current via the connecting elements or for establishing a short-circuit between the connecting elements. The short-circuit may preferably be produced if: i) the circuit is configured as a protective circuit; and ii) the voltage between the connecting elements exceeds a threshold value.

The docking module may as well comprise a circuit which provides a function different from that of a protective circuit, such as a shunt resistor.

The present concept enables coupling or docking of the docking module onto the current transformer in an easy, efficient, and uncomplicated manner. Such docking is particularly useful if the current transformer is to be retrofitted to be enhanced with the functionality implemented in the docking module. Retrofitted herein means that a user initially has a current transformer which does not have the functionality implemented in the docking module; if the current transformer is desired to be enhanced with the functionality implemented in the docking module the current transformer can then be retrofitted with the docking module. The docking module may therefore be regarded as a retrofit module.

The current transformer is essentially a short-circuited transformer that is used for potential-free measurement of alternating currents. It is preferably used for feeding ammeters or energy meters.

The primary winding of the current transformer often comprises a single turn, for example a copper rail, while the secondary winding has a higher number of turns. This means that in an open-circuit state the voltage of the primary circuit will be transformed to an even higher voltage in the secondary circuit. The high voltage in the secondary circuit may cause danger to persons or damage of the current transformer.

The circuit may represent a protective circuit for the current transformer. The protective circuit serves to prevent a secondary voltage on a secondary circuit of a current transformer from exceeding a secondary voltage threshold. The secondary voltage threshold may, for example, have a value preset during manufacturing of the protective circuit, or a value adjustable by an operator.

The protective circuit may have a protective circuit input, preferably in the form of contact pins or a pair of terminals, which can be coupled to the secondary circuit of the current transformer so that the secondary voltage is applied to the protective circuit input.

The protective circuit may further comprise a control unit connected to the protective circuit input, and a switch unit connected to the protective circuit input and operatively connected to the control unit.

The control unit may be adapted to provide a control signal to the switch unit in response to the secondary voltage exceeding the secondary voltage threshold. The secondary voltage value which is compared with the secondary voltage threshold may be an amplitude, a mean value, an instantaneous value, or an effective value of the secondary voltage.

The control unit may be implemented in form of an electronic circuit, for example on a semiconductor basis, in particular in form of an integrated circuit.

The switch unit may be adapted to short-circuit the protective circuit input in response to the control signal supplied from the control unit. The control signal may be provided on the line connecting the control unit with the switch unit, namely in form of a voltage which changes its value when the secondary voltage threshold is exceeded or in response thereto, for example from LOW to HIGH, or vice versa.

Short-circuiting of the protective circuit input may mean that the switch element adopts a low electrical resistance value of less than $10\Omega$, or $1\Omega$, or $0.1\Omega$ which is thus connected to the protective circuit input.

The switch unit may be implemented as a semiconductor circuit. The semiconductor circuit may preferably be implemented in form of a semiconductor switch or semiconductor relay. Here, a semiconductor switch refers to a switch implemented on semiconductor basis. A semiconductor relay refers to a relay implemented on semiconductor basis.

When compared to electromechanical relays (EMR), switches or relays implemented on semiconductor basis provide a variety of functional features:
  Semiconductor switches are typically smaller than EMRs, thereby allowing to save valuable space on printed circuit boards.
  Semiconductor switches offer better system reliability because they do not have any moving parts or contacts that could wear out.
  Semiconductor switches switch without bouncing.
  Semiconductor switches offer better system life costs, including a simpler circuit with lower power requirements and lower heat dissipation requirements.
  Semiconductor switches can use surface mount technology (SMT), resulting in lower assembly costs and simple circuit board assembly.
  Semiconductor switches cannot be affected by magnetic fields.
  Semiconductor switches are not susceptible to mechanical influences such as shock and vibration.
  Semiconductor switches do not generate any electromagnetic interference and are not susceptible to such influences (EMC, EMI).
  Semiconductor switches can be processed like ICs on printed circuit boards.

The circuit, in particular the protective circuit, may be mounted on a circuit board, and the connecting element may protrude beyond the circuit board and/or out of the docking module. In this case the connecting element may be formed as a tongue-shaped tab which protrudes from the housing or the docking module, and the tab is in particular designed as a tongue-shaped projection of the circuit board.

The docking module preferably comprises a housing in which the circuit, in particular the protective circuit, is accommodated. The housing may be made of an electrically insulating material, such as special ceramics with high contents of aluminum oxide, steatite, porcelain, glass, plastics, glass-fiber reinforced or hydrophobic plastics.

Due to the high currents that are to be expected in case of a short-circuit, a low contact resistance at the connecting element is desirable. Therefore, the tab may be coated on one or both faces thereof with an electrically conductive material, in particular a metal, preferably with gold, silver, or copper.

The coatings on both faces of the tab may be interconnected through a via of the circuit board. The usefulness of a via is the improved electrical contact (on both sides, upper and lower side) to a corresponding element, preferably a secondary terminal of the current transformer. If, as the case may be, the coatings on the tab are not interconnected, two electrical connections can be provided with one tab or one connecting element.

The connecting element can be urged and pressed against the current transformer by means of a clamping element, preferably a screw, and the connecting element preferably has a notch in an end portion facing the current transformer. Urging of the connecting element against the current transformer may serve to establish or enhance electrical contact to the current transformer, preferably to one of the secondary terminals of the current transformer. Tightening of the clamping element may as well serve to secure, mount, or attach the docking module to the current transformer.

The docking comprises establishing or improving electrical contact between the connecting element and the current transformer. For docking the docking module, preferably the following procedure is possible: i) the screw is loosened; ii) the connecting element is inserted into the complementary opening provided on the side of the current transformer; iii) the screw is tightened thereby establishing electrical contact to the current transformer or mounting the docking module to the current transformer.

Preferably, the housing has locking elements which are adapted to cooperate with locking elements of the circuit board to form a locking mechanism for securing the circuit board to the housing. Due to the locking mechanism, the circuit board can be inserted into the housing and locked therein. The locking mechanism in particular serves to produce a hardly releasable, preferably non-releasable mechanical connection between the circuit board and the housing.

Another aspect of the present disclosure relates to a current transformer, preferably a straight-through transformer to which a docking module as described above can be docked or coupled.

Various aspects of the present disclosure including:
  the size of the protective circuit may be very much smaller compared to conventional protective circuits;

a current transformer with integrated protective circuit can be provided, which in terms of its dimensions does not or only slightly differ from a conventional current transformer; and that a very low response time of the protective circuit is ensured.

Further features of the present disclosure are associated with the implementation of the control unit and the switch unit on semiconductor basis.

The features of the following modifications and embodiments of the present disclosure may be combined with the aspects of the present disclosure mentioned above.

According to one embodiment, the controller can be connected directly to the input of the protective circuit.

Furthermore, the switch unit can be connected directly to the input of the protective circuit.

Here, "directly connected" means that the component "control unit" and/or "switch unit" is directly coupled or connected to the input of the protective circuit, without any electrical or mechanical elements arranged between the component and the protective circuit input.

The protective circuit may comprise a limiting unit connected to the input of the protective circuit, for overvoltage protection. The limiting unit may comprise a voltage-dependent resistor. The voltage-dependent resistor has a constant value as long as the voltage applied to the limiting unit is below a threshold value. When the voltage exceeds the threshold value, the resistor reduces its value, so that the current through the resistor increases and the voltage applied across the resistor does not exceed the threshold value.

The limiting unit, the switch unit, and the control unit complement and support each other with respect to the protective function for the current transformer. On the one hand, this is because the switch unit is designed for greater currents than the limiting unit. Together, the switch unit and limiting unit components can tolerate a higher current than either component alone.

On the other hand, the limiting unit supports the control unit, since by virtue of the parallel connection of limiting unit and control unit a defined voltage is provided or allowed at the input of the control unit. Hence, the likelihood of damage to the control unit by an excessive voltage at the input of the control unit can be reduced.

In addition, the usage of the limiting unit allows to use components for the control unit and the switch unit, which are not designed for high voltages, so that low-cost components can be employed for this purpose.

According to one embodiment, the control unit may comprise a comparator unit which is adapted to provide the control signal to the switch unit if an input voltage of the comparator exceeds a threshold value.

The control unit may further comprise a rectifier connected to the protective circuit input for providing a DC voltage, preferably a pulsating DC voltage which depends on an amplitude of the secondary voltage, as an input voltage for the comparator unit.

The rectifier enables the control unit to respond during both negative and positive half-waves of the secondary voltage, which provides for a further shortening of the response time.

According to one embodiment, the comparator unit may comprise a comparator having a positive input, a negative input on which a voltage of approximately the level of the input voltage of the comparator unit is applied, and an output which provides the control signal.

The comparator may further comprise a voltage divider, wherein the positive input is connected to the input voltage of the comparator unit via the voltage divider. As a result, an input voltage reduced according to the division ratio of the voltage divider can be supplied to the positive input of the comparator.

The comparator unit may furthermore comprise a Zener diode which is connected to the negative input, for limiting a voltage applied to the negative input. This ensures that the voltage applied at the negative input of the comparator is not greater than the breakdown voltage of the Zener diode.

The comparator unit may comprise a capacitor which is connected to the positive input.

According to one embodiment, the switch unit may include a plurality of MOSFETs.

The switch unit may comprise two MOSFETs arranged in a back-to-back circuit. In this case, the drain terminals of the transistors may be connected to the respective terminals of the protective circuit input, and the gates may be connected to the control unit for supplying the control signal. The back-to-back circuit can be used for very high currents. In addition, the back-to-back circuit is AC compatible, since current flow is possible in both directions.

The switch unit may in particular comprise a solid-state relay (SSR).

Alternatively, the switch unit may comprise a thyristor, preferably a triode for alternating current (TRIAC). A TRIAC has a very high internal resistance up to its reverse voltage, so it does not affect the measurement accuracy of the current transformer. On the other hand, its internal resistance decreases rapidly to values of $\ll 1\Omega$ when triggered, so that a secondary short-circuit of the transformer is produced then.

The switch unit may comprise an opto-isolator for injecting the control signal. In this manner, the switch unit can be galvanically isolated from the control unit.

According to one embodiment, the limiting unit may comprise a transient voltage suppression (TVS) diode, or transient absorption Zener (TAZ) diode. The TVS diode provides protection against short overvoltage pulses for the protective circuit input and for all components connected thereto, such as the secondary circuit, control unit, and switch unit.

Alternatively or additionally, the limiting unit may comprise a varistor and/or a gas discharge tube to protect the input of the protective circuit from short overvoltage pulses.

According to one embodiment, the protective circuit may be accommodated directly on the current transformer, more specifically in the housing of the current transformer, preferably in a secondary terminal box of the current transformer. In this case, a housing of the current transformer may be configured so as to comprise the secondary terminal box in which the secondary circuit terminals of the current transformer are arranged, and a secondary circuit housing, in which the secondary coil of the current transformer is disposed.

For an assembly comprising a current transformer and a protective circuit, an accommodation of the protective circuit in this manner provides enhanced weather resistance due to its compact design.

The present disclosure will now be explained in more detail by way of illustrative embodiments and with reference to the drawings wherein the same reference numerals denote the same or equivalent elements. The features of different illustrative embodiments may be combined.

DETAILED DESCRIPTION

Figure 6:
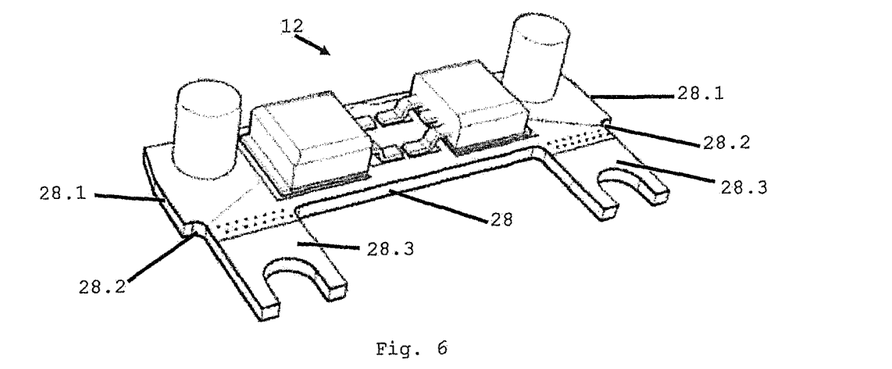
FIG. 6 is a perspective view of the circuit which forms part of a docking module.
Figure 7:
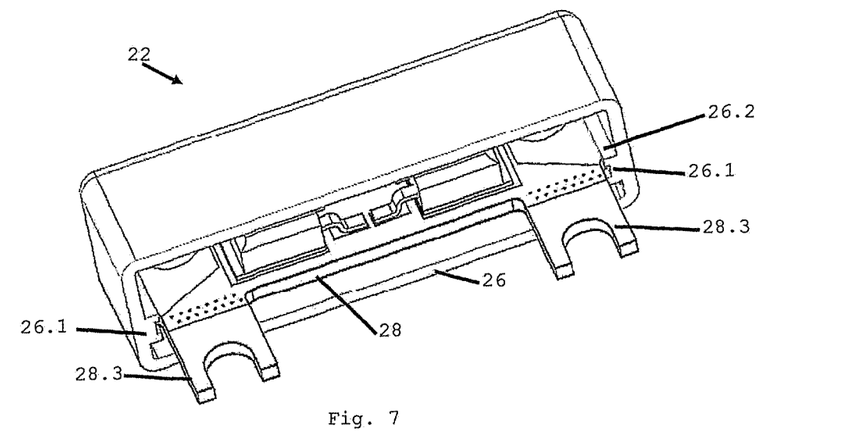
FIG. 7 is a perspective view of the docking module.

FIG. 6 is a perspective view of circuit 12 implemented as a protective circuit which forms part of a docking module 22 that has two connecting elements 28.3. FIG. 7 is a perspective view of the docking module 22 in which the housing 26 of docking module 22 can be seen as well.

Circuit 12 is mounted on a circuit board 28, and connecting elements 28.3 protrude beyond the circuit board 28 and extend out of the docking module 22, what can be seen in FIG. 7. Here, connecting elements are designed as tongue-shaped tabs 28.3 projecting from housing 26 of the docking module 22, and in particular tabs 28.3 are designed as tongue-shaped projections of the circuit board 28. Here, tabs 28.3 are gold-plated on both faces thereof (upper surface and lower surface).

Connecting elements 28.3 can be pressed against current transformer 10 by means of screws 30, the connecting elements 28.3 having notches in end portions facing the current transformer 10. For docking the docking module 22, the following procedure is suggested:

i) screws 30 are loosened;
ii) connecting elements 28.3 are inserted into complementary openings 38 provided on the side of the current transformer; and
iii) screws 30 are tightened thereby establishing electrical contact to current transformer 10 and at the same time securing or mounting the connecting elements 28.3 to current transformer 10.

Figure 5:
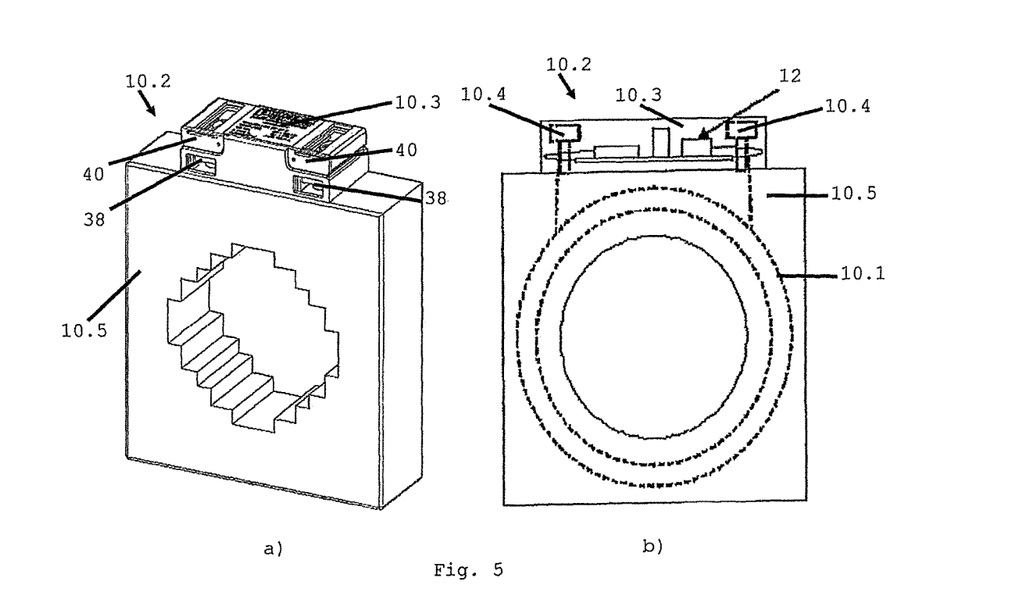
FIG. 5a is a perspective view of a current transformer.
FIG. 5b is a sectional view of the current transformer.

In a state of the connecting elements 28.3 inserted into the openings 38 of current transformer 10, the connecting elements establish an electrical connection between the secondary terminals 10.1 of the current transformer 10 and an input 12.1 of protective circuit 12 (openings 38 can be seen in FIG. 5a). Current transformer 10 comprises screw connections which make electrical contact between the secondary terminals 10.1 of current transformer 10 and the connecting elements 28.3 when the screws 30 are tightened.

Paired screws 30 enable to secure the docking module 22 implemented as a retrofit module on the one side and the connecting cables 36 to ammeter 20 on the other side of current transformer 10. Corresponding contact elements (on one side towards docking module 22 and on the opposite side towards connecting cables 36) are already provided in current transformer 10, so that the connecting cables 36 and/or the docking module 22 can be secured to current transformer 10 at any time. Therefore, the retrofit module may as well be attached to current transformer 10 already prior to the installation of the current transformer, which considerably simplifies installation in the field.

Above the screws 30, slides 40 are arranged (see FIG. 5a), which in an inserted state thereof cover the space above screws 30 to prevent ingress of dust into the interior of docking module 22 and in a retracted state provide access to screws 30.

As can be seen in FIG. 6 and FIG. 7, housing 26 has locking elements 26.1, 26.2 which are adapted to cooperate with locking elements 28.1, 28.2 of the circuit board 28 to define a locking mechanism for securing circuit board 28 on housing 26.

Housing 26 has, in an interior lateral region and opening region, a rib including a groove 26.2 preferably extending along or in parallel to lateral edges of housing 26. Groove 26.2 is closed at the opening of housing 26 by a groove end 26.1. Complementary to the locking elements of housing 26, the circuit board 28 has locking elements 28.1, 28.2 comprising a protruding dam 28.1 with a dam corner 28.2.

Preferably, each of the locking elements groove end 26.1, groove 26.2, and dam 28.1 with dam corner 28.2 are formed in pairs.

In an inserted state of circuit board 28 in the housing 26, groove 26.2 of housing 26 accommodates the dam 28.1 of circuit board 28 while dam corner 28.2 of circuit board 28 will be locked behind the closed front end 26.1 of the groove.

The locking of groove end 26.1 and dam corner 28.2 constitutes the locking mechanism for securing the circuit board 28 on housing 26. This locking mechanism prevents loosening of the circuit board 28 from housing 26 or removal of the circuit board 28 from housing 26 and thus constitutes a solid, stable, preferably non-releasable mechanical connection between circuit board 28 and housing 26.

Docking module 22 and current transformer 10 may be considered as a plug-in system. The tabs 28.3 of docking module 22 constitute a male part in this case, and the openings 38 of current transformer 10 constitute a receptacle area for receiving the male part. Receptacle area 38 defines a longitudinal guide for the male part 28.3 along which the male part 23.8 is movable.

In the plug-in system, the male part 28.3 when inserted in the receptacle area 38 is fixed by a releasable locked connection, preferably by a releasable force-locked connection. Locking may be achieved by spring means or retaining members such as for example magnetic elements. Tabs 28.3 may comprise or may be in the form of the spring means, e.g. omega-shaped springs or coffin springs, in order to ensure mechanical pressing of tabs 28.3 against contact elements of the current transformer and hence reliable electrical contact between tabs 28.3 and the contact elements of the current transformer on the one hand, and locking on the other hand.

The described plug-in system in which the male part (tabs 28.3) can be directly inserted into and removed from the receptacle area 38 of the current transformer 10 permits disconnecting of the docking module 22 from the current transformer 10 in easy and uncomplicated manner and to easily assemble the two components with just a few simple steps, minimum effort, and without special tools.

Figure 8A:
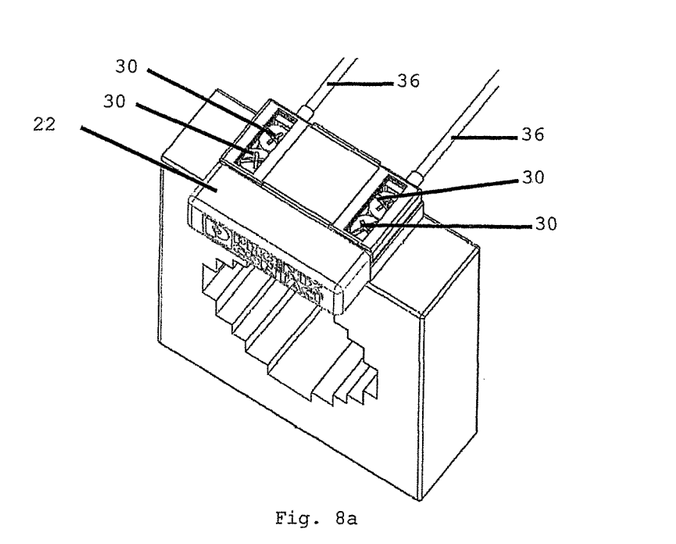
FIG. 8a is a perspective view of a current transformer comprising the docking module.

FIG. 8a shows a perspective view of the current transformer 10 with the docking module 22 already docked thereto. In the state shown, the docking module 22 is firmly pressed or docked to current transformer 10 and cannot be readily separated from current transformer 10, whereby high mechanical stability and operational safety of the current transformer 10 is ensured.

Figure 8B:
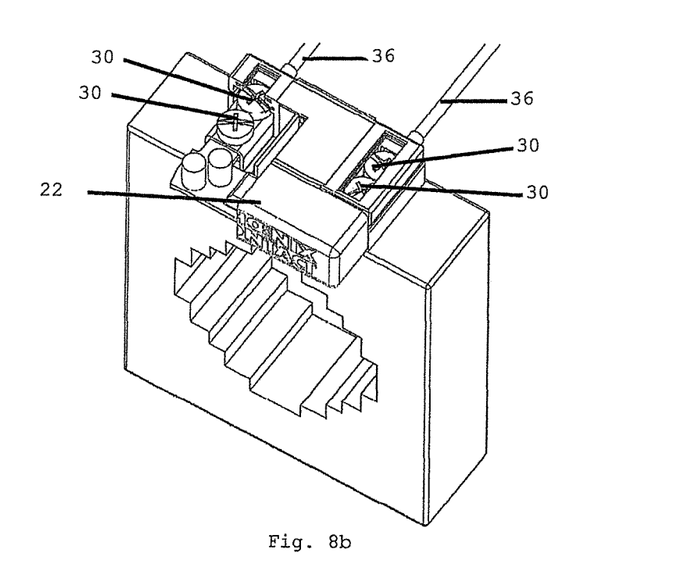
FIG. 8b is a perspective view of a current transformer comprising the docking module and providing exposed insight into the docking module.

FIG. 8b shows the assembly comprising current transformer 10 and docking module 22 with exposed insight into the docking module 22. Here it can be seen how electrical contact between connecting element 28.3 and current transformer 10 is made.

Opening 38 includes a channel-shaped thin-walled metallic receptacle for connecting element 28.3, with openings toward the screws 30 for insertion of the screws 30 and with threaded bores on the side opposite to the openings. A screw 30 introduced into an opening can be screwed into the threaded bore by being turned, whereby a connecting element 28.3 received and clamped in the receptacle is compressed, i) for producing electrical contact between the upper and/or lower coating of the connecting element 28.3 and the channel-shaped receptacle; and ii) for mechanically securing the docking module 22 to the current transformer 10.

Figure 1:
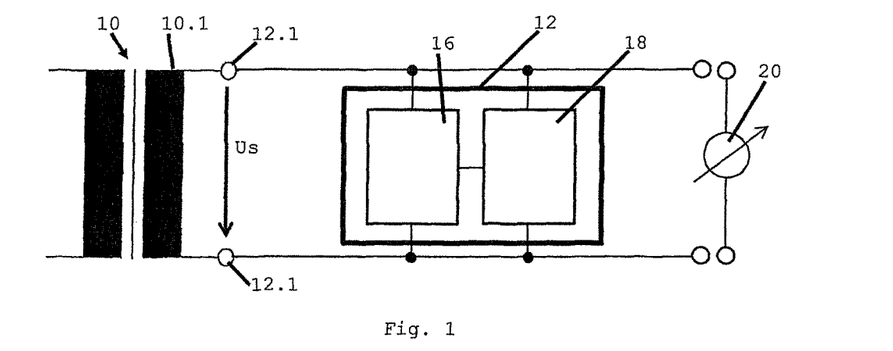
FIG. 1 is a schematic diagram of a first embodiment of the protective circuit in combination with a current transformer.

FIG. 1 shows a first illustrative embodiment of the protective circuit 12 for a current transformer 10.

Protective circuit 12 serves to prevent a secondary voltage Us in a secondary circuit 10.1 of the current transformer 10 from exceeding a secondary voltage threshold.

Protective circuit 12 comprises:
- a protective circuit input 12.1 coupled to the secondary circuit 10.1 of the current transformer 10 so that the secondary voltage Us is applied to the protective circuit input 12.1;
- a control unit 16 connected to the protective circuit input 12.1; and
- a switch unit 18 connected to the protective circuit input 12.1 and operatively connected to the control unit 16.

Control unit 16 is adapted to provide a control signal to the switch unit 18 in response to the secondary voltage Us exceeding the secondary voltage threshold.

Switch unit 18 is adapted to short-circuit the protective circuit input 12.1 in response to the control signal provided by the control unit 16.

FIG. 1 further shows an ammeter 20 which is adapted for measuring the current flow through secondary circuit 10.1. During the measuring operation, an overvoltage in the secondary circuit 10.1 is very unlikely to occur. However, when the ammeter 20 is disconnected from secondary circuit 10.1, which is indicated in FIG. 1, the probability for an overvoltage or excessive secondary voltage Us to occur increases substantially.

The functioning of protective circuit 12 will be explained below.

When an excessive secondary voltage Us occurs at the secondary circuit 10.1, the voltage applied to control unit 16 exceeds a preset secondary voltage threshold. In response to the threshold being exceeded, control unit 16 provides a control signal to switch unit 18, which changes from LOW to HIGH, for example. In response to the control signal, switch unit 18 reduces its internal resistance to nearly zero thus short-circuiting the secondary circuit 10.1.

Figure 2:
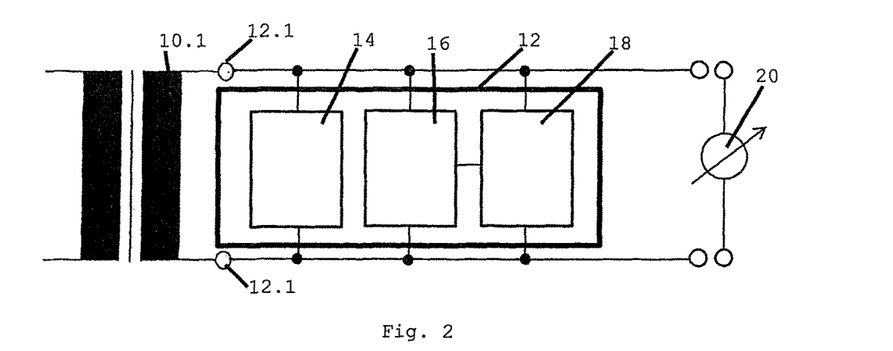
FIG. 2 is a schematic diagram of a second embodiment of the protective circuit in combination with a current transformer.

FIG. 2 shows a second illustrative embodiment of the protective circuit 12 for a current transformer 10. In contrast to the first illustrative embodiment, the protective circuit 12 according to the illustrative embodiment shown in FIG. 2 comprises a limiting unit 14 which is connected in parallel to control unit 16 and to switch unit 18, and which is connected to the secondary circuit 10.1.

The limiting unit 14, switch unit 18 and control unit 16 complement and support each other with respect to the protective function for current transformer 12. On the one hand, this is because switch unit 18 is designed for greater currents than limiting unit 14. Together, the components switch unit 18 and limiting unit 14 can tolerate a higher current than either component alone.

On the other hand, limiting unit 14 supports control unit 18, since by virtue of the parallel connection of limiting unit 14 and control unit 18 a defined voltage is provided or allowed at the input of the control unit 18.

As is generally known, transient voltage suppression (TVS) diodes which are preferably employed for limiting unit 14 still have a finite internal resistance after reaching the breakdown voltage (see FIG. 4), so that they can only carry continuous currents that are lower than the usual secondary nominal currents of transformers. This is a possible reason why so far no protective circuits have been known that consist solely of TVS diodes.

The short time required for shorting switch unit 18 ensures a negligible inertness of protective circuit 12, since control unit 16 is capable of "sampling" each half wave of the voltage at secondary circuit 10.1. Therefore, as soon as the voltage has dropped below a predetermined threshold, the secondary-side short-circuit caused by protective circuit 12 is automatically eliminated in the shortest time. Triggering occurs periodically.

Figure 3:
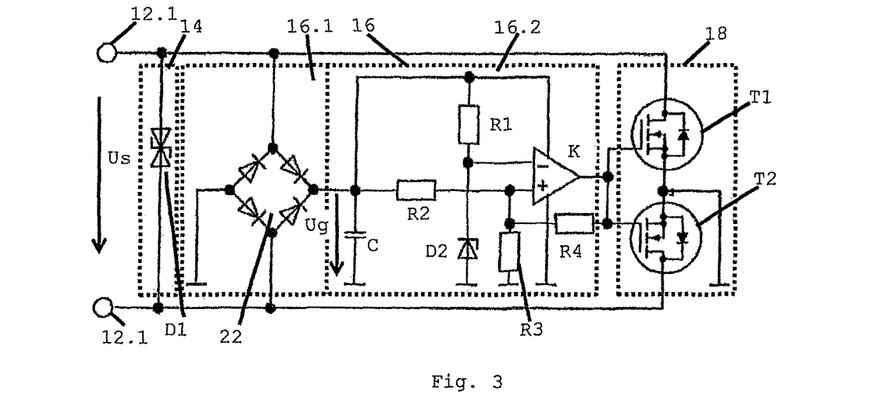
FIG. 3 is a detailed schematic diagram of the second embodiment of the protective circuit.

FIG. 3 shows details of the embodiment of the protective circuit 12 shown in FIG. 2. Accordingly, control unit 16 comprises a rectifier 16.1 and a comparator unit 16.2. Comparator unit 16.2 comprises:
- a comparator K having a positive input, a negative input at which a voltage of approximately the level of the input voltage of comparator unit 16.2 is applied, and an output which provides the control signal;
- a voltage divider R2, R3, wherein the positive input is connected to the input voltage of the comparator unit 16.2 via the voltage divider R2, R3;
- a Zener diode D2 which is connected to the negative input, for limiting a voltage applied to the negative input;
- a capacitor C which is connected to the positive input.

Figure 4:
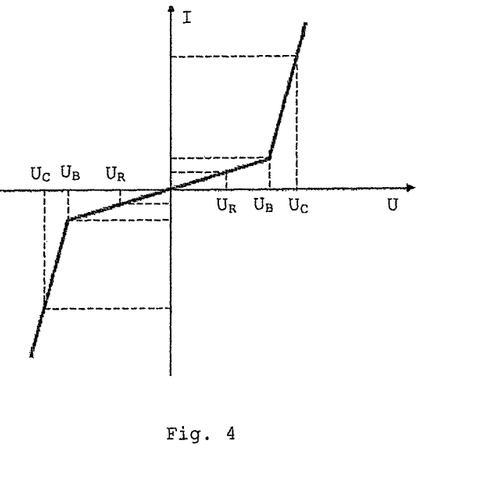
FIG. 4 shows a current-voltage characteristic of a transient voltage suppression diode.

Limiting unit 14 comprises a transient voltage suppression (TVS) diode D1. A current-voltage characteristic of the TVS diode D1 is schematically shown in FIG. 4. As can be seen therefrom, TVS diode D1 operates bidirectionally in the reverse mode. The forward characteristic is irrelevant. Significant points of the curve are:
UR reverse standoff voltage
UB breakdown voltage;
UC clamping voltage.

Switch unit 18 comprises two MOSFETs T1, T2 arranged in a back-to-back circuit. Here, the drain terminals of transistors T1, T2 are connected to the respective terminals of the protective circuit input, and the gates are connected to the comparator K of comparator unit 16.2 for supplying the control signal.

In this case, a short-circuit is automatically established with the small and lightweight semiconductors of the two N-channel FETs arranged in the back-to-back circuit.

The two transistors T1, T2 short-circuit the alternative current through secondary circuit 10.1 virtually without power consumption. This permits to divert very high currents, such as a thermal rated short-time withstand current which is 60 times the nominal current of 5 A, i.e. 300 A, for one second, and to divert a rated overvoltage current which is 2.5 times the rated short-time withstand current, i.e. 750 A, for one half-wave.

Short-circuiting is effected before the voltage exceeds a dangerous level. Such a value corresponds to a ratio of rated power to rated secondary current of the transducer.

According to FIG. 3, the rectified voltage Ug is compared with the voltage at a Zener diode D2, by comparator K. The current through rectifier 22 charges the capacitor C which provides the necessary voltage for comparator K and for driving transistors T1, T2.

As soon as the voltage at the input of comparator K reaches the threshold voltage of comparator K, the secondary circuit 10.1 is short-circuited and capacitor C discharges through R1, R2, R3, D1, and K, until the turn-off voltage at the positive input of comparator K is reached again.

For example, if R4 is very large and at the same time R2, R3 are equal, then a resulting secondary voltage threshold will be twice the Zener voltage. Thus, the parameters of the components of control unit 16, preferably the parameters of R1, R2, R3, D1, and K, allow to define the secondary voltage threshold, in particular in relation to the secondary voltage Us.

The operating voltage of comparator K is isolated from the short-circuit by the rectifier diodes. If after elimination of the short-circuit an excessive voltage continues to exist at secondary circuit 10.1, the process is repeated, so that the turn-on voltage at the positive input of comparator K can never be exceeded.

The turn-on and turn-off voltages at the positive input of comparator K are separated via R4 due to a hysteresis of the comparator unit 16.2, so that no undefined oscillations can arise. The switching thresholds are determined by the Zener diode D2 and the hysteresis that is set. The ratio of resistors R2, R3 to capacitor C determines the frequency at which a switching event occurs.

This protective circuit 12 can be accommodated in the head of current transformer 10 and can be hard-wired to the secondary circuit 10.1. Thus, the automatic short-circuiting will always work, regardless of where the secondary circuit 10.1 is interrupted.

When the protective circuit 12 is accommodated in a switch cabinet, for example, which houses the components of a system in which the current transformer 10 is arranged for a current measurement, a connecting cable to the protective circuit 12 can be interrupted at any point between the current transformer 10 and the ammeter 20, directly or immediately at the terminals of the current transformer 10 or of the ammeter 20.

It is also possible for the protective circuit 12 to be integrated into the secondary circuit once the current transformer 10 has been manufactured. That is to say, current transformer 10 can be retrofitted with the protective circuit 12.

One way to reduce costs and installation size is to limit the maximum current of the secondary circuit 10.1 by varying the material of the current transformer 10. By adapted core material, the magnetic flux can be limited which also limits the current in the secondary circuit 10.1.

FIGS. 5a, 5b show two views of a current transformer housing 10.2 which accommodates a current transformer 10. Current transformer housing 10.2 comprises:
- a secondary circuit housing 10.5 which accommodates the secondary circuit 10.1 of current transformer 10; and
- a secondary terminal housing 10.3, also known as "secondary terminal box", which accommodates the secondary terminals at which the secondary voltage Us can be tapped.

Protective circuit 12 is preferably accommodated or arranged in secondary terminal box 10.3 of current transformer housing 10.2. Protective circuit 12 is disposed directly or immediately next to the secondary terminals of secondary circuit 10.1. Thus, the protective circuit is completely integrated in the housing 10.2 of current transformer 10.

LIST OF REFERENCE NUMERALS

10 Current transformer
10.1 Secondary circuit of current transformer
10.2 Housing of current transformer
10.3 Secondary terminal box, secondary terminal housing
10.4 Secondary circuit terminals
10.5 Secondary circuit housing
12 Protective circuit
12.1 Protective circuit input
14 Limiting unit
16 Control unit
16.1 Rectifier
16.2 Comparator unit
18 Switch unit
20 Ammeter, shunt resistor
22 Docking module
26 Housing of docking module 22
26.1 Closed end of groove
26.2 Groove
28 Circuit board, PCB
28.1 Dam
28.2 Corner of dam
28.3 Electric connecting element, tab
30 Clamping element, fastener, screw
36 Connecting cable to ammeter 20
38 Opening for receiving connecting element 28.3
40 Slide
D1 Transient voltage suppression (TVS) diode
D2 Zener diode
K Comparator
R1-R4 Resistors
T1, T2 Transistors
Ug DC voltage
Us Secondary voltage

The invention claimed is:

1. A docking module for a current transformer, comprising:
   an electronic circuit; and
   at least one electric connecting element for electrically coupling the circuit to the current transformer and for docking the docking module onto the current transformer,
   wherein the circuit is a protective circuit for preventing a secondary voltage on a secondary circuit of the current transformer from exceeding a secondary voltage threshold when either a short circuit is interrupted or an ammeter and/or a shunt resistor is removed on the secondary side of the current transformer.

2. The docking module as claimed in claim 1, wherein the circuit is mounted on a circuit board.

3. The docking module as claimed in claim 1, comprising at least one of the following features:
   the docking module comprises a housing in which the circuit is accommodated; or
   locking elements of the housing are adapted to cooperate with locking elements of the circuit board to define a locking mechanism for securing the circuit board to the housing.

4. A docking module for a current transformer, comprising:
   an electronic circuit; and
   at least one electric connecting element for electrically coupling the circuit to the current transformer and for docking the docking module onto the current transformer, wherein
   the circuit is mounted on a circuit board, and
   the connecting element can be pressed against the current transformer by a clamping element that establishes electrical contact to the current transformer; or
   the docking module comprises two connecting elements.

5. The docking module as claimed in claim 1, comprising at least one of the following features:
the connecting element protrudes from the docking module;
the connecting element is in form of a tongue-shaped tab protruding from the housing or the docking module;
the tab is formed as a tongue-shaped projection of the circuit board;
the tab is coated with an electrically conductive material on one or both faces thereof; or
the tab is coated with a metal.

6. The docking module as claimed in claim 1, wherein the protective circuit comprises:
a protective circuit input which can be coupled to the secondary circuit of the current transformer such that the secondary voltage is applied to the protective circuit input;
a control unit connected to the protective circuit input; and
a switch unit connected to the protective circuit input and operatively connected to the control unit;
wherein
the control unit is adapted to provide a control signal to the switch unit in response to the secondary voltage exceeding the secondary voltage threshold;
the switch unit is adapted to short-circuit the protective circuit input in response to the control signal supplied from the control unit; and
the switch unit is implemented as a semiconductor circuit.

7. The docking module as claimed in claim 6, comprising at least one of the following features:
the control unit is connected directly or immediately to the protective circuit input;
the switch unit is connected directly or immediately to the protective circuit input; or
the protective circuit comprises a limiting unit connected to the protective circuit input, for overvoltage protection.

8. The docking module as claimed in claim 6, wherein the control unit comprises one or more of the following components:
a comparator unit which is adapted to provide the control signal to the switch unit if an input voltage of the comparator unit exceeds a threshold; or
a rectifier connected to the protective circuit input for providing a direct current voltage depending on an amplitude of the secondary voltage as an input voltage for the comparator unit.

9. The docking module as claimed in claim 8, wherein the comparator unit comprises one or more of the following components:
a comparator having a positive input, a negative input on which a voltage of approximately the level of the input voltage of the comparator unit is applied, and an output which provides the control signal;
a voltage divider, wherein the positive input is connected to the input voltage of the comparator unit via the voltage divider;
a Zener diode which is connected to the negative input, for limiting a voltage applied to the negative input; or
a capacitor which is connected to the positive input.

10. The docking module as claimed in claim 6, wherein the switch unit comprises one or more of the following components:
at least one MOSFET;
two MOSFETs arranged in a back-to-back circuit;
a solid-state relay with (i) a MOSFET, or (ii) a plurality of MOSFETs arranged in parallel;
a TRIAC; or
an opto-isolator for introducing the control signal.

11. The docking module as claimed in claim 7, wherein the limiting unit comprises one or more of the following components:
a transient voltage suppression diode;
a varistor; or
a gas discharge tube.

12. A current transformer comprising a docking module, including:
an electronic circuit; and
at least one electric connecting element for electrically coupling the circuit to the current transformer and for docking the docking module onto the current transformer;
wherein the circuit is a protective circuit for preventing a secondary voltage on a secondary circuit of the current transformer from exceeding a secondary voltage threshold when either a short circuit is interrupted or an ammeter and/or a shunt resistor is removed on the secondary side of the current transformer.

13. The docking module as claimed in claim 4, wherein the clamping element includes a screw to establish electrical contact to at least one of the secondary terminals of the current transformer, the connecting element having a notch in an end portion thereof facing the current transformer.

14. The docking module as claimed in claim 5, wherein the metal includes gold, silver, or copper.

15. The docking module as claimed in claim 8, wherein the direct current voltage is a pulsating direct current voltage.

16. A docking module for a current transformer, comprising:
an electronic circuit;
at least one electric connecting element for electrically coupling the circuit to the current transformer and for docking the docking module onto the current transformer;
a circuit board, wherein the circuit is mounted on the circuit board; and
a housing including a groove accommodating the circuit board and a groove end behind which a dam corner is locked to lock the circuit board to the housing.

17. The docking module as claimed in claim 16, wherein the at least one electric connecting element includes two tongue-shaped tabs projecting from the circuit board.

18. The docking module as claimed in claim 17, wherein the tabs have notches in end portions thereof.

19. A docking module for a current transformer, comprising:
an electronic circuit; and
at least one electric connecting element for electrically coupling the circuit to the current transformer and for docking the docking module onto the current transformer; and
a circuit board, wherein the circuit is mounted on the circuit board and wherein the connecting element includes a projection of the circuit board.

20. A docking module for a current transformer, comprising:
an electronic circuit; and
at least one electric connecting element for electrically coupling the circuit to the current transformer and for docking the docking module onto the current transformer;

wherein the circuit is a protective circuit adapted to short-circuit a protective circuit input for preventing a secondary voltage on a secondary circuit of the current transformer from exceeding a secondary voltage threshold.

21. A current transformer comprising a clamping element and a docking module including:
- an electronic circuit; and
- at least one electric connecting element for electrically coupling the circuit to the current transformer and for docking the docking module onto the current transformer, wherein the connecting element can be pressed against the current transformer by the clamping element that establishes electrical contact to the current transformer.

* * * * *